(12) United States Patent
Karppanen (10) Patent No.: US 10,845,953 B1
(45) Date of Patent: Nov. 24, 2020

(54) IDENTIFYING ACTIONABLE CONTENT FOR NAVIGATION

(71) Applicant: Amazon Technologies, Inc., Reno, NV (US)

(72) Inventor: Jari Juhani Karppanen, Bellevue, WA (US)

(73) Assignee: AMAZON TECHNOLOGIES, INC., Seattle, WA (US)

(*) Notice: Subject to any disclaimer, the term of this patent is extended or adjusted under 35 U.S.C. 154(b) by 0 days.

(21) Appl. No.: 15/636,251

(22) Filed: Jun. 28, 2017

(51) Int. Cl.
*G06F 3/048* (2013.01)
*G06F 3/0482* (2013.01)
*G06F 3/0487* (2013.01)
*G06F 30/20* (2020.01)
*G06F 3/033* (2013.01)
*G06F 40/197* (2020.01)

(52) U.S. Cl.
CPC .......... *G06F 3/0482* (2013.01); *G06F 3/0487* (2013.01); *G06F 30/20* (2020.01); *G06F 3/033* (2013.01); *G06F 40/197* (2020.01)

(58) Field of Classification Search
CPC ............. G06F 3/04842; G06F 3/04845; G06F 3/0488; G06F 3/1423; G06F 3/0487; G06F 3/0482; G06F 17/5009; G06F 40/197; G06F 30/20; G06F 3/033
See application file for complete search history.

(56) References Cited

U.S. PATENT DOCUMENTS

| 6,643,641 | B1* | 11/2003 | Snyder | G06F 17/30864 707/709 |
| 7,584,194 | B2* | 9/2009 | Tuttle | G06F 17/30864 |
| 7,917,755 | B1* | 3/2011 | Giliyaru | G06F 17/2211 382/181 |
| 9,053,177 | B1* | 6/2015 | Seo | G06F 17/30864 |
| 2003/0115167 | A1* | 6/2003 | Sharif | G06F 3/0489 |
| 2004/0025190 | A1* | 2/2004 | McCalla | A63F 13/10 725/133 |
| 2005/0268214 | A1* | 12/2005 | Lu | G06F 16/9577 715/207 |
| 2009/0063979 | A1* | 3/2009 | Haber | G06F 3/0482 715/719 |
| 2009/0100345 | A1* | 4/2009 | Miller | G06F 11/3688 715/738 |
| 2011/0173589 | A1* | 7/2011 | Guttman | G06F 17/30873 717/125 |
| 2013/0019152 | A1* | 1/2013 | Rau | G06F 17/30861 715/208 |
| 2019/0286461 | A1* | 9/2019 | Toksos | G06F 9/453 |

* cited by examiner

*Primary Examiner* — Thu V Huynh
(74) *Attorney, Agent, or Firm* — Hogan Lovells US LLP (57) ABSTRACT

A modified navigation scheme can be generated for content that is to be rendered and/or displayed via a client device with a limited or unconventional control scheme. A copy of the content can be generated, and that copy tested to determine locations where actions occur, such as requests or modifications generated, in response to a simulated input action. The actions themselves can also be analyzed to determine whether the actions satisfy one or more selection criteria. The resulting actionable elements can be included in a modified navigation scheme that is sent with the content, either as modified content or supplemental content that enables the content to be navigated using the control scheme of the client device.

16 Claims, 8 Drawing Sheets

IDENTIFYING ACTIONABLE CONTENT FOR NAVIGATION

BACKGROUND

Users are increasingly consuming content electronically through a variety of different types of devices. Instead of viewing content, such as web pages, through conventional computers, users are accessing such content through smart devices such as smart televisions and wearable computers. In many instances, the device used to access the content will not have a conventional computer input device such as a keyboard, touch screen, or mouse. It can then be difficult for a user to interact with the webpage or other rendered content, as many instances of content are not designed to be used with such devices. While the content can be modified to generate a version that is easier to use with such devices, such an approach would be very expensive and it is difficult to automatically determine an appropriate version of the content using conventional approaches.

BRIEF DESCRIPTION OF THE DRAWINGS

Various embodiments in accordance with the present disclosure will be described with reference to the drawings, in which.

DETAILED DESCRIPTION

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Approaches in accordance with various embodiments provide mechanisms for accessing content in an electronic environment. In particular, various approaches enable a modified navigation scheme to be generated for content that is to be rendered and/or displayed via a client device with a limited or unconventional control scheme, at least one that is not directly applicable to the type of content to be displayed. A copy of the content can be generated, and that copy tested to determine locations where actions occur, such as requests or modifications generated, in response to an input action. The actions themselves can be analyzed to determine whether these actions satisfy one or more selection criteria. The resulting actionable elements can be included in a modified navigation scheme that is sent with the content, either as modified content or supplemental content, and that enables the content to be navigated using the control scheme of the client device.

Various other functions can be implemented within the various embodiments as well as discussed and suggested elsewhere herein.

Figure 1:
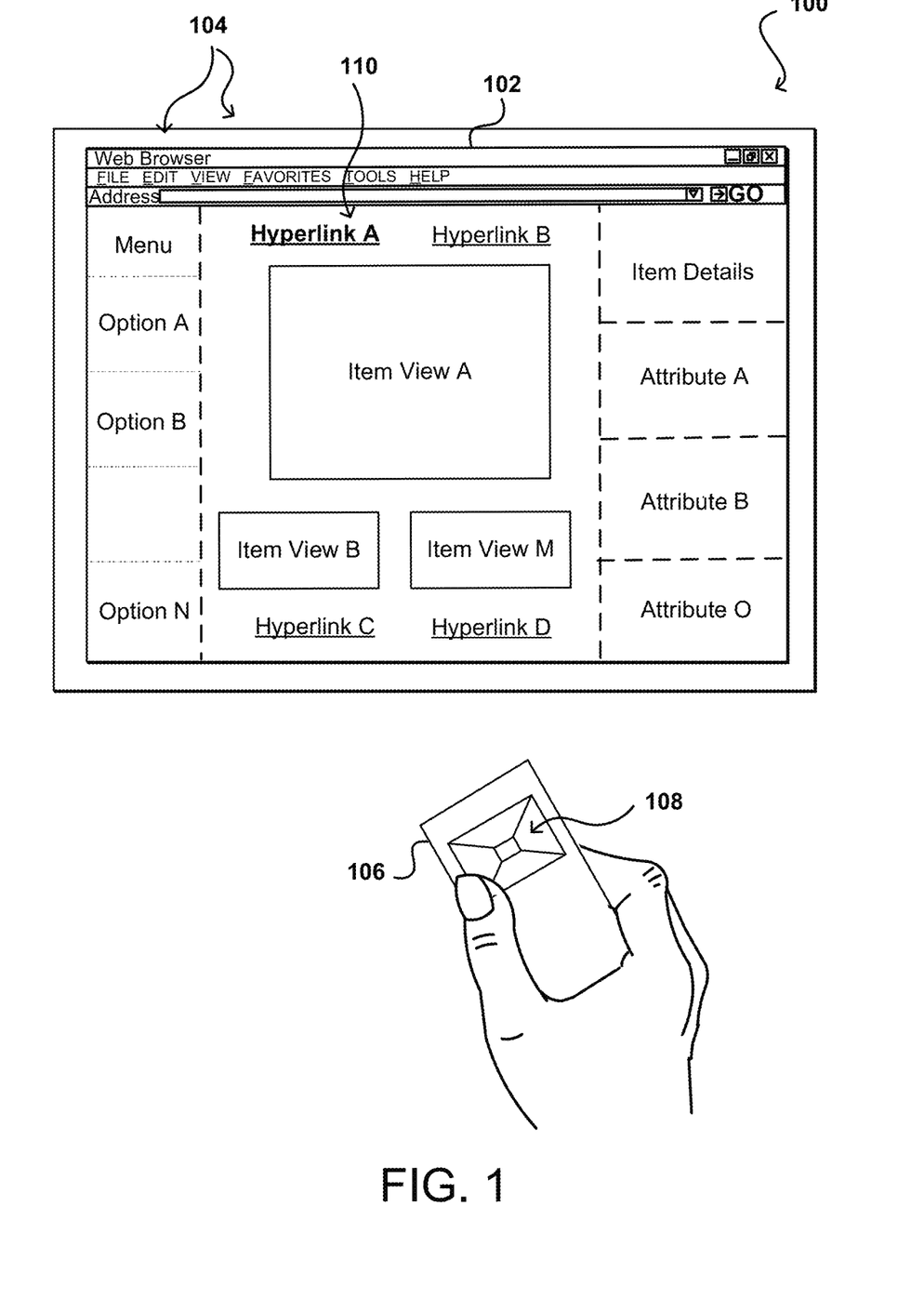
FIG. 1 illustrates an example approach to interacting with content that can be utilized in accordance with various embodiments.

FIG. 1 illustrates an example situation 100 wherein content is rendered and displayed through an interface 102, such as a web browser, in accordance with various embodiments. As illustrated, the content can include various elements, such as text, images, and video elements. At least some of these elements can be "actionable" elements. Actionable elements, as used herein, refer to elements with which the user can interact in some way, such as by selecting, hovering a cursor over, dragging, or clicking using a mechanism such as a mouse cursor, keyboard key entry, or touch screen interaction, among other such options. The corresponding action can be any appropriate action(s), which in some embodiments can depend at least in part upon the type of interaction. The action can include, for example, navigating to a new page, showing a list of options, popping up a new window, entering or selecting text, zooming on an image, and so on. Various interactions and types of corresponding elements are known for content such as web pages and computer interfaces and can be used within the scope of the various embodiments. A user can view the content and use an appropriate input mechanism to interact with the appropriate actionable elements displayed.

In the example situation 100 illustrated in FIG. 1, however, the content is being displayed on a display, such as smart television, or a television connected to a content rendering device, that enables a user to control the content using a remote control 106 or other such input device. As illustrated, the remote control 106 may have limited input options. For example, the remote control can have a set of buttons 108 that allow for directional input, such as up, down, right, or left, as well as a selection input. Various other input types can be utilized or provided as well. In order to be able to use such input, the content needs to be generated or presented in such a way that the user can scroll or step through various actionable elements 104 until the user finds the element of interest, which the user can then select. For example, the user might want to navigate to a particular hyperlink 110 in order to navigate to the corresponding page or set of content.

Oftentimes, however, the content is not designed for such navigation. Many websites or application pages are designed for touch screen or mouse input, where a user can directly select the location for the interaction. Using directional buttons on a remote control can require significant effort if the user must repeatedly press or hold the buttons to get to an appropriate location. It can be preferable, it at least some embodiments, to enable the user to cycle through the actionable elements using the buttons, such that if there are only ten actionable elements on a page then at most the user would have to initiate about ten button pushes to get to the element of interest, and in many instances can access the content of interest in a couple of button presses.

Difficulties can arise for such approaches, however, as the content was not designed for such input approaches. The actionable elements will not be specifically set forth and ordered or arranged for such input. An arbitrary page of content can include any combination of types of content elements, some of which will be difficult to determine as actionable. For example, a selection of an area on a bitmap image might trigger a backend process to occur, but it might be difficult to determine from the page that the region of the image is an actionable item. Even if it is determinable, many conventional browsers or applications do not include the capability to make such a determination. In one example, a webpage might include a number of script-based event listeners on any element of the page. These scripts may execute arbitrary code, which can make it difficult to determine which of these elements are selectable, or otherwise capable of user interaction or input, for navigation or other purposes. A web browser application on a smart television might then be unable to provide a user with the capability of selecting specific elements or accessing specific functionality. In order to enable such access, some type of navigation links or mechanism need to be identified or generated in various embodiments, enabling the user to navigate to, and select, the elements using the buttons 108 of a remote control 108 or other such input device. While navigation can be triggered programmatically, such as by using JavaScript or another scripting language to construct and follow a uniform resource locator (URL), the URL string does not exist before the event handler's script is executed.

Approaches in accordance with various embodiments can provide for the navigation of content using such devices by identifying the navigable or actionable elements of the content. In some embodiments, a script execution engine and/or rendering engine of a rendering system can support state checkpoints for various types of content. When a page or other grouping or selection of content is identified, a copy-on-write version of the content state can be generated. This copy will store the current state of the page to be rendered. A type of hit testing can then be performed, wherein a synthetic touch gesture or other such locationed input is sent to an event handler. The event handler can utilize a scripted listener, such that any impact resulting from the synthetic gesture and the scripted code can be detected. The impact can be analyzed to determine whether the coordinate or location on the page, or with respect to the content, should be designated as a selectable link, or other actionable element, of the content. Such an element can be selected using, for example, a remote controller for a television or other such device. Other input elements can include buttons on a watch, motion gestures, or input joystick, among other such options. For the duration of the checks, a drawing or rasterization pipeline can be paused in order to prevent visual changes to the content. Further, the network stack may be disabled such that no actual output or action occurs from, or with respect to, the page.

Various embodiments can analyze the content to identify various types of actionable elements. The types of actionable elements to be identified can change over time, such as may be a result of user input, developer input, machine learning, artificial intelligence, and the like. Examples of actionable elements include, but are not limited to, hyperlinks, selectable buttons, checkboxes, image maps, drop down boxes, and text fields, among other form and GUI elements known or used with various types of content. Factors that can be utilized in order to determine whether elements are actionable, or an extent to which they are actionable, can include corresponding impact related to actual scripted navigation requests, significant changes to the DOM or other aspects of the page or content, a state change to the browser or application, or a change in state of a form element, among other such options. The change in state of a browser may relate to the execution of an API method, such as to minimize or enter full screen mode, while a form element state change may relate to setting a checkbox to a set or unset state, etc. In some embodiments various hooks may be implemented to receive calls from the content and function as a proxy, whereby the hook can detect the call but direct the call to a different location. If, during the analysis, executed script for a potential element does not lead to a user-perceptible impact, or satisfy at least one other impact criterion, then the element will not be determined to be an actionable element, or may be classified as a low importance element that may perform some action but the action does not rise to the level that causes the element to be classified as actionable per the specified criteria. As an example, if an element only results in the sending of metric or clickstream data for collection by a backend service, which is not user-perceptible, then that element would not be identified as an actionable element. In some embodiments, a browser can represent navigable coordinates as artificially-created or "false" links in, for example, a shadow version or copy of the DOM for the page.

In one embodiment, a shadow version of the DOM can be created and an analysis process can iterate through the various coordinates of the page to attempt to determine locations associated with potentially actionable elements. This can include, for example, starting at one corner of the page and iterating through the various coordinates, such as in a raster pattern. In some embodiments an initial pre-processing of the page may be performed to attempt to reduce the search space for the page. For example, areas that are simply representative of a background color with no elements or other content may be excluded from the search in some embodiments. Further, areas that clearly correspond to actionable elements such as hyperlinks to other pages or domains may be quickly identified as actionable elements and then the associated regions eliminated from the coordinate-based analysis. Various other approaches for determining areas or regions for analysis can be used as well, as discussed and suggested elsewhere herein.

In one embodiment the analysis will iterate through the coordinates of the search space for the content until all coordinates have been analyzed or another end criterion is reached. A previous checkpoint of the script and state of the rendering engine can then be restored by discarding any changes made since the checkpoint due to the testing and analysis. Since any changes or outward communication by the content are suppressed during the analysis, there will be no user-perceptible changes or actions to the actual content unless presented as part of the display process as discussed elsewhere herein. The analysis process effectively sandboxes the rendering and scripting engines during the analysis so any actions, calls, or impact can be detected but not actually enacted for the content. For example, the selection of an element that generates a navigation request can cause the analysis to detect that navigation request, but not actually act on that navigation request. The detection of the request itself is sufficient in various embodiments, and analysis of the target destination may be analyzed in some embodiments to determine the level of the impact.

In one embodiment, a full copy of the scripting engine state can be utilized together with an artificial read-only DOM or other such content structure. A read-only DOM can be generated that has a similar structure to the actual DOM for the content, including similar node identifiers and content for a webpage. Such an approach may not allow for actual changes to be made and tested, but can instead increment a counter whenever a node change is detected. Multiple different tests can be run in parallel threads, for example, by using thread-local copy-on-write implementation with respect to the shadow DOM.

Figure 2:
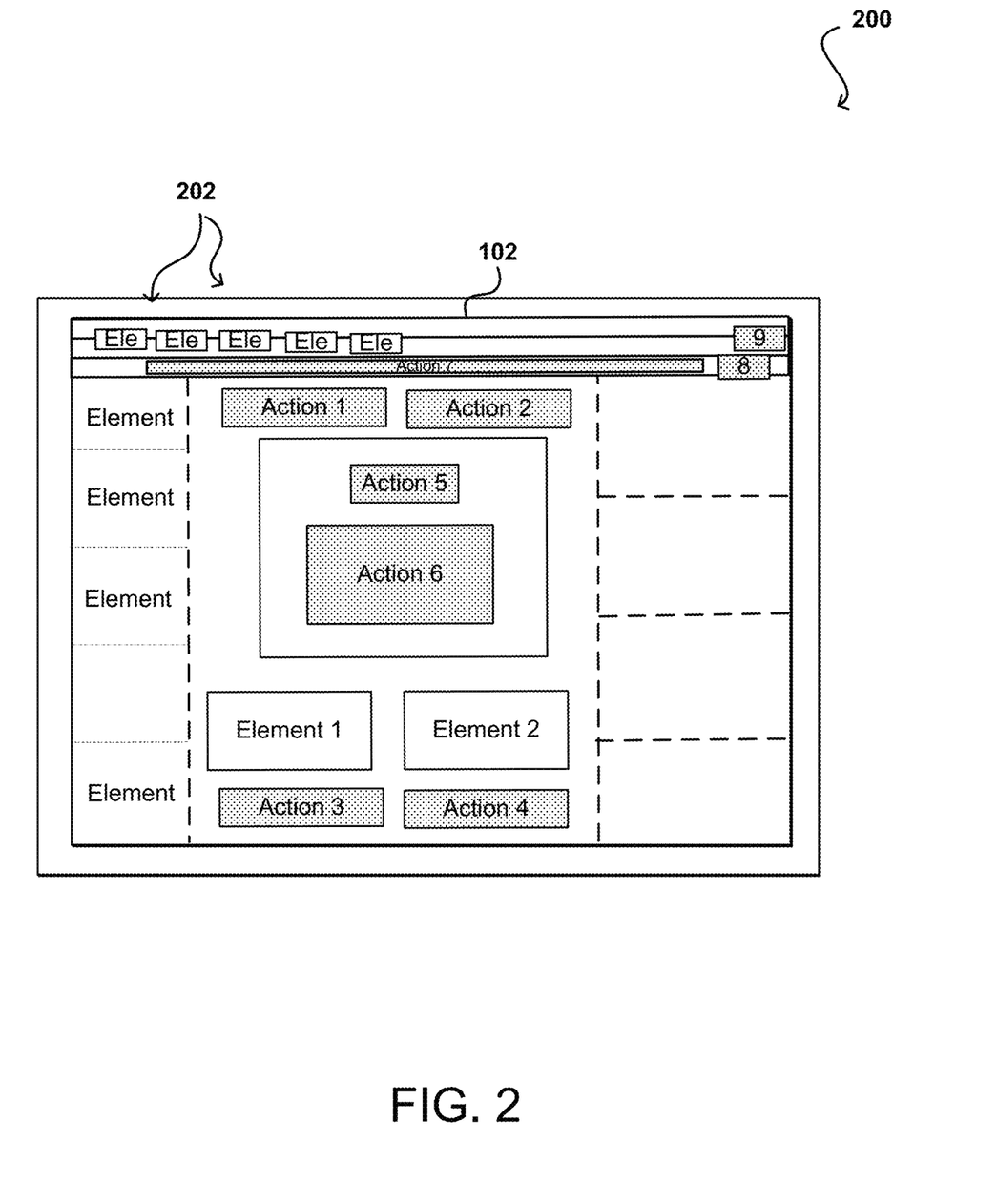
FIG. 2 illustrates an example analysis that can be performed with respect to the interface of FIG. 1 in accordance with various embodiments.

FIG. 2 illustrates a display 200 of a set 202 of example actionable elements and other elements that can be detected from the content 102 illustrated in FIG. 1. In this example, various elements have been identified from the content with which a user could interact. Some of these elements have been identified as actionable elements, as having satisfied at least one action criteria. For some embodiments, these actionable elements can then be caused to be selectable using the arrows of a remote control or other input, where the user can cycle through the actionable elements on the page. As illustrated, there are other elements identified that do not satisfy at least one action criterion. These elements can be tracked as less important or relevant elements, for example, which in some embodiments will not be navigable using a basic remote device control scheme as discussed herein. A user can have the option, however, of adjusting a setting or preference to enable these additional elements to be included in the scheme, wherein the user can also navigate to, and interact with, these elements. This can take more effort on the part of the user to reach a particular element, but can enable the user to access more functionality. The criteria used to select actionable elements can be set or adjusted in order to balance these and other factors. In the example set 202, hyperlinks and navigation elements were identified as actionable elements. Other elements such as display options or category details may be identified as elements, but not actionable elements such that they would not necessarily be reachable using a remote device control scheme as discussed herein.

Figure 3:
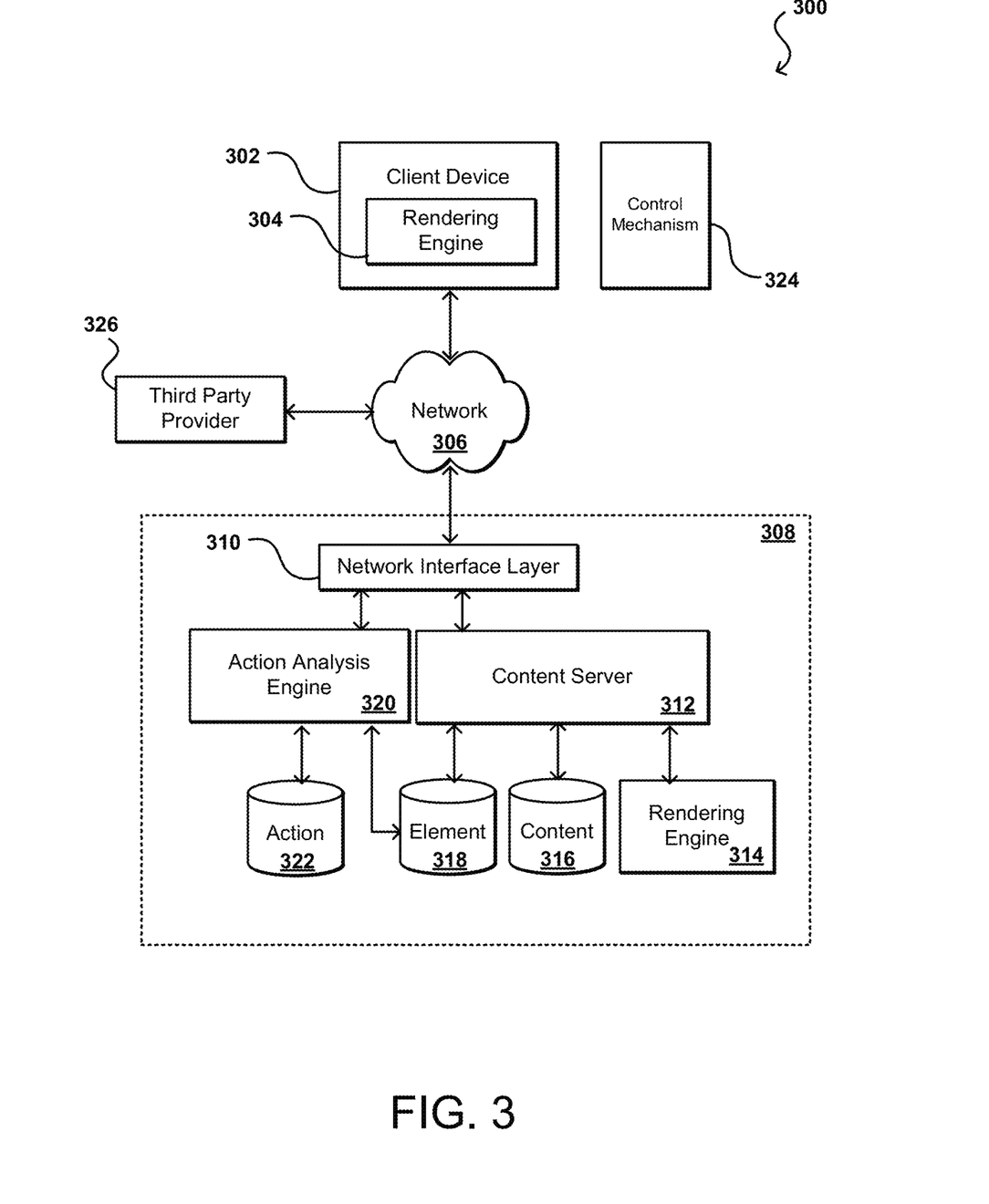
FIG. 3 illustrates an example system that can be utilized to implement aspects of the various embodiments.

When doing the analysis, it will frequently not be possible to access the actual page source code because the content will come from another provider, such as a third party provider 326 as illustrated in the example system 300 of FIG. 3. Thus, an action analysis engine 320 or other system or component that analyzes the content will not be able to see server-side script and other content that is not transmitted with the content in an accessible manner. Since such script is not accessible, there is not a straightforward approach to determining whether the script does anything useful or that would otherwise be determined to be actionable. There may also be cases where an action such as a hover or drag leads to an action without a specific click or selection, so the approaches to determining the actionable elements are not straightforward.

Thus, an action analysis engine 320 can work with a content server 312 to obtain the content from a content data store 316, third party provider 326, client device 302, or other such source. The action analysis engine 320 can create a copy of the page for testing and analysis. As mentioned, the content can be scanned using an identified scanning approach, such as a coordinate- or pixel row-based approach. The action analysis engine 320 can attempt to perform a selection or other interaction at least tested location to attempt to determine actionable elements. In some embodiments not every pixel location will be tested, as one-pixel elements are rarely actionable elements, such that every third, fifth, tenth, or other such pixel may be tested, as may be based upon resolution, preference, or other such factors. Other approaches can be utilized to take a reasoned approach to testing a webpage, or other content, to identify actionable items without causing any user-visible changes or externally visible navigation, etc.

In one example, the action analysis engine 320 will generate a test copy of the content and store the copy in memory on the relevant server or computing device. The engine can then perform a type of hit testing, for example, wherein synthetic representations of gestures or user inputs can be generated and tested against the content. A resulting action in response to one of the synthetic representations can then be analyzed to attempt to determine or infer whether the resulting action satisfies one or more actionable criteria, so as to be significant enough to make that element selectable through the remote device control scheme. As mentioned, there may be multiple levels or types of elements identified. For example, there can be navigational elements that are important and other elements that may not be as important. An ordering or ranking can then be applied to each identified element to determine the elements for which to enable selection per various criteria. For example, an interface could enable selections of elements of a certain determined level, can enable up to the twenty highest ranked elements, or can enable elements with scores above a minimum selection criteria, among other such options. The remote control scheme can then enable cycling through the enabled elements using the arrow keys, or other inputs, and then selecting a currently highlighted element or element that is otherwise of current focus in the interface. In some embodiments, there may be various rankings or orderings available, as discussed elsewhere herein, and a user may be able to select between the various rankings or navigation schemes. These might include, for example, rankings or orderings for a work or home context, when a user wants to watch movies versus listening to music, etc. Any relevant criteria can be used to select or determine an available navigation scheme as may be learned over time, specified by a provider, or based upon preferences of a user, among other such options. In a video context, for example, links to video files may be ranked more highly than links to descriptions or other pages, while in other contexts the ranking may be reversed. In some embodiments, information from various users can be aggregated and analyzed to determine links of interest, which can be used in the ranking process to ensure that links of higher interest are ranked more highly in the generated or modified navigation scheme.

In the example system 300 of FIG. 3, the content at issue is to be rendered on a client device 302. The rendering can occur using a rendering engine 304 of the client device 302, a rendering engine 314 associated with the content server 312, or a combination thereof. In this example, the client device is not a conventional computing device, such as a desktop computer or tablet computer, but is a device with processing and/or display capability that is able to convey content and enable at least some level of interaction with that content through, for example, a control mechanism 324. The control mechanism 324 can be, for example, a remote control for a smart television or media device, or a set of buttons or control stick for a virtual reality headset, set top box, or a video game system, among other such options. While the client device can display the content as rendered, there can be navigation and use challenges as discussed herein. Accordingly, the system can utilize the action analysis engine 320 with the content server 312 to provide content that is appropriate for interaction on the client device 302.

The content can originate from a content provider network 308, for example, as may be provided in response to a request received over a least one network 306, such as the Internet, an intranet, a local area network, a cellular network, or another appropriate wired and/or wireless network. The content can be rendered using a rendering engine 304 on the client device and/or a rendering engine 314 in the resource provider environment 308, among other such options. In this example, at least some of the content can be pulled from a content repository 316 and rendered by a rendering engine 314 before being provided to the client device 302 by at least one content server 312. A request for the content can be received to a network interface layer 310, which can include one or more interfaces such as application programming interfaces (APIs) for receiving requests, as well as various other network components such as routers, load balancers, and the like. In at least some embodiments the content server 312 or another appropriate component can cause data to be written to at least one log, as may include information regarding the content served.

The content can be delivered across the network(s) 306 to the client device 302. A rendering engine for a Web browser on a smart television might, for example, take markup language content such as HTML and formatting information to render Web content to be displayed on the client device 302 that can be formatted to fit the display and the current zoom level, etc. Various other components such as layout or placement engines can be used as well within the scope of the various embodiments. These engines can render data once the data is received, or may begin rendering as the data is received, among other such options. Further, a rendering engine might render only that portion of the content that will be visible, or may render some additional amount that can reduce the likelihood of chunking or delayed rendering in response to a navigation or zoom action, among other such possibilities.

In various embodiments, the content server 312 can determine information about the type of client device 302 from which the request is received. This can be based upon information received with the request or information stored in the environment 308 and associated with a device or user identifier, or IP address, among other such options. Upon determining that the client device 302 is of a type with limited navigational input capability, the content server 312 can determine if a version of the content is stored that can be provided to the client device. In some embodiments, this may not be a different version of the content but additional data regarding the actionable elements identified for the content, as may be stored to an element repository 318 or other such location. The content server can serve the element data with the content to be rendered for display on the client device. This can enable navigation of the content using the control mechanism 324 among other such options.

It might be the case, however, that element information or other data regarding actionable elements is not available for the content. The content server 312 can then communicate with an action analysis engine 320, or other such system or component, to obtain the actionable element data. The action analysis engine can then obtain the content, from the content server, a content repository 316, a third party 326, or another such source. The engine can create a copy of the content, but in various embodiments will not create, for example, a copy of the entire page and script engine for a webpage. A copy of a subset of the content, such as the DOM for a webpage, can be created and cached in memory by the engine 320. The engine can then select an initial testing location and perform testing at each of a set of locations for the page. As mentioned, this can include synthetic or fake input or selection actions, among other such options. The check pointing approach can test the content at various locations and monitor whether any actions or changes occur. Changes made to the nodes of the DOM can be made to replacement nodes of the shadow copy, or the respective copy for multiple concurrently utilized copies, such that the original copy will not be modified. Each replacement or "phantom" node that is spawned can be assigned a node identifier for purposes of tracking and analysis. As mentioned, requests and actions can be blocked such that the test procedure can detect the initiation of such actions, but not allow such actions to actually be performed. In some embodiments, this can involve generating a false network context, such that any call to a scripting engine can have the false context information inserted such that the call will not fail but no action will actually be taken because the target does not actually exist. JavaScript or other script within the context of the actual page can continue to function as normal if the analysis is being done while the content is displayed on the client device.

The information can be captured and stored for the various locations of the content. Once all testing locations have been analyzed, or another end criterion reached, the changes and replacement nodes can be discarded, along with the shadow copy, and the information for the actionable elements can be stored with, in associated with, the original page content. Such an approach also enables the content to be transmitted to the device 302 for rendering and display, which for image and other content can take some amount of transmission time, so that at least some of the page content can be displayed when the actionable element data is received. Such an approach can also minimize the user-apparently latency due to analyzing complex scripts utilized by the content.

As mentioned, in addition to detecting an action at least some embodiments also attempt to determine an impact of the action. As an example, some actions may be determined to be more important than others. Navigation to another page may be considered to potentially be of significant interest to a user, as well as changes to portions of the displayed content. On the other hand, actions that send data to a back end server for data collection purposes but have no visible impact on a user may not be viewed as having significant impact. The analysis can thus involve at least two parts: determining whether an action occurs for an element or location, and then determining a significance of the action. In some embodiments every action by a scripting engine will pass through an API, so the API can be monitored and actions tagged for phantom node generation and impact analysis. Any time the returns a result or passes a maximum execution time for a location or element, an evaluation can be performed to determine whether the action was of significance. Any indeterminable actions can either be ignored, as being unable to be evaluated, or set as an actionable item to be conservative and not inadvertently leave out access to something that might be important to a user. Further, once an element is determined to be actionable then any associated script can be aborted in order to conserve resources. The level of action can vary as well. In some embodiments any change to the DOM may be considered of impact and actionable, while in others the impact may depend at least in part upon the size of the impacted portion(s) of the DOM.

In some embodiments this analysis and navigable element production can be implemented for any content sent to such a client device 302. In other embodiments the analysis may be performed only in response to a certain action, such as a user picking up a remote control or attempting to interact with a page of content via the device. Such an approach may provide a bit of latency with the navigation, but can save considerable resources that would otherwise be needed to analyze every page of content to be displayed. In some embodiments an amount of pre-processing might be performed on the device, such as to allow for navigation to hyperlinks or other easily detectable actionable elements that can be determined quickly on the client device. As additional actionable elements are detected by an analysis engine, for example, those can be added to the navigational options on the client device. If element data is already available but stored separately, that data might be transmitted to the client device upon detection of such actions at the client device.

Figure 4:
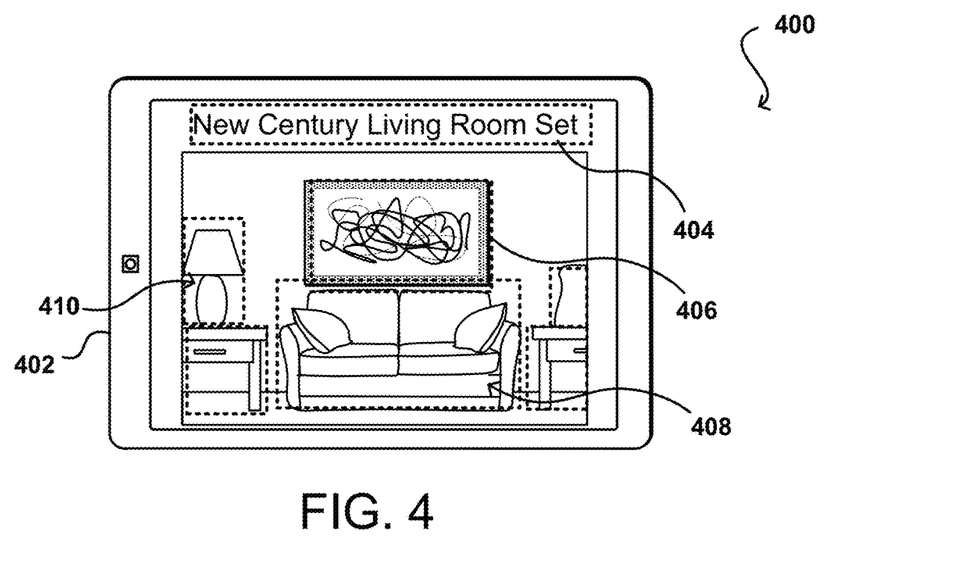
FIG. 4 illustrates an example action area determination for rendered content that can be generated in accordance with various embodiments.

In some embodiments, changes made to the navigation scheme for the content may conflict. For example, a pixel might be associated with two overlapping elements, or an action taken by one element might change an aspect, such as a location and size, of another actionable element. In some embodiments where multiple shadow copies are evaluated concurrently, there may be conflicts resulting from the various copies. In other embodiments, a change resulting from one actionable element may create a conflict with another actionable element on the page. Various other conflicts can arise as well within the scope of the various embodiments. In the event of such a conflict, a most recent change can be reverted to avoid the conflict. In other embodiments, the elements of the conflict can be analyzed to determine which to roll back. In other embodiments all elements for the conflict can be reverted. As an example, the image displayed in the situation 400 of FIG. 4 includes regions that correspond to different items. Here, the items are household items. It might be the case that a portion of the painting 406 on the wall is near or behind a portion of the couch, such that the associated bounding boxes at least partially overlap. Or selection of the couch makes its representation expand over that of the painting. In such a situation, the region of overlap might be reverted such that it is excluded from either actionable area, with the non-overlapping portions being associated with actionable regions. It should also be mentioned that regions resulting in the same action can be correlated as a single actionable element. This can be a result of testing each location separately, or testing various locations and then assuming that locations in-between are also of the same element. This can be useful for elements such as an image with an image map, as illustrated on the device 402 of FIG. 4, where different regions of the image map correspond to different items 404, 406, 408, 410 but the locations of each item should be associated with a single element for that item.

Figure 5:
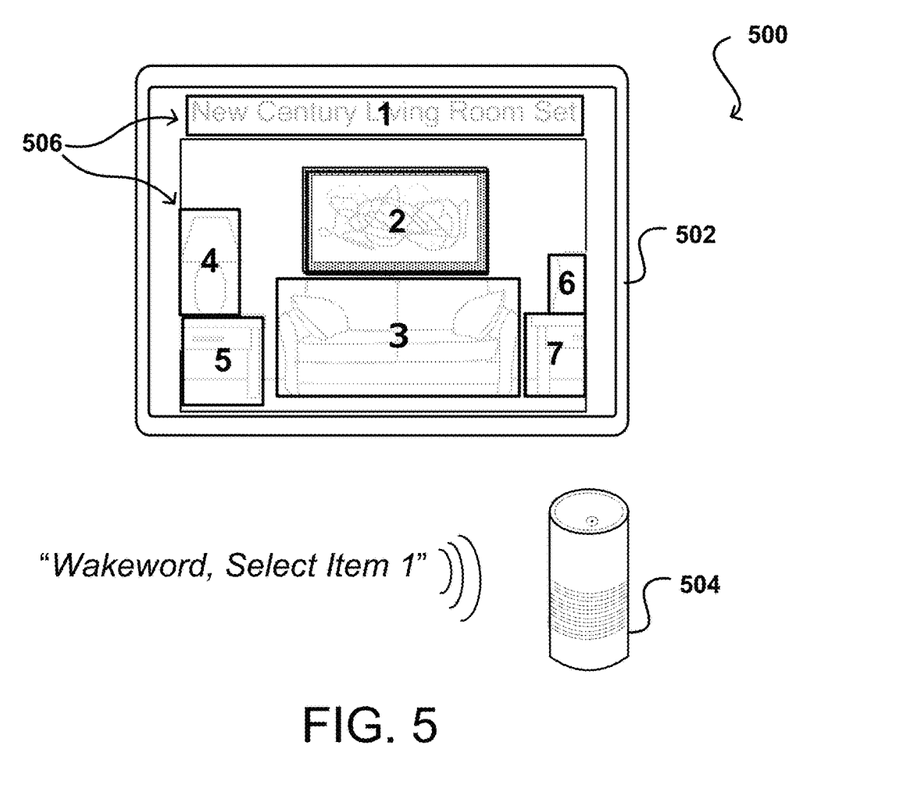
FIG. 5 illustrates an example action area determination for rendered content that can be generated in accordance with various embodiments.

It might be the case that the input mechanism is not a remote control or set of buttons at all, but potentially a voice, movement, or gesture activated input. For example, the system 500 of FIG. 5 includes a display element 502, such as a smart television, and a voice input capture device 504, such as an Echo by Amazon.com, Inc. A user can provide input by, for example, speaking a wake word such as "Alexa" followed by an instruction, such as "follow link 3." The types of voice inputs that can be processed and approaches to processing such input are known in the art and, as such, will not be discussed in detail herein. In order to provide for simplified user navigation, at least some modification of the display of content can be performed. In this example, a graphical element 506 will be rendered for each actionable element determined for the display of content. In this example, the actionable elements can be ordered and the graphical element for each element can include the order number, as well as a bounding box or other such item that helps to identify the region or element corresponding to the number. If a user wants to select an element, the user can speak a voice command that identifies the actionable object, such as "link 2" or "element 7". The input may also be flexible to handle natural language, such as to allow for "go to number 7" or "show me number 4," among other such actions. The ranking of items can also vary by type of device, as contextual information may be used to adjust the ranking. For example, a smart TV user might be more likely to select a link to play a movie, while a user of a health watch might be substantially unlikely to select such a link In some embodiments the actionable element data can be stored for a page once determined. Such an approach can prevent the need for the page to be reanalyzed each time it is accessed by types of devices that can benefit from such a navigation scheme. In order to ensure the information is up to date, there can be some type of versioning control used such that the content is reanalyzed when a new version is received. In other embodiments the changes between versions can be analyzed such that the content is only reanalyzed in response to a significant change. For example, if an element lists a current date or user name then that page content will change frequently, but the actual actionable element data will remain unchanged. In such an instance the basic DOM structure can be analyzed to determine a change in any structural elements or nodes, among other such options.

Figure 6:
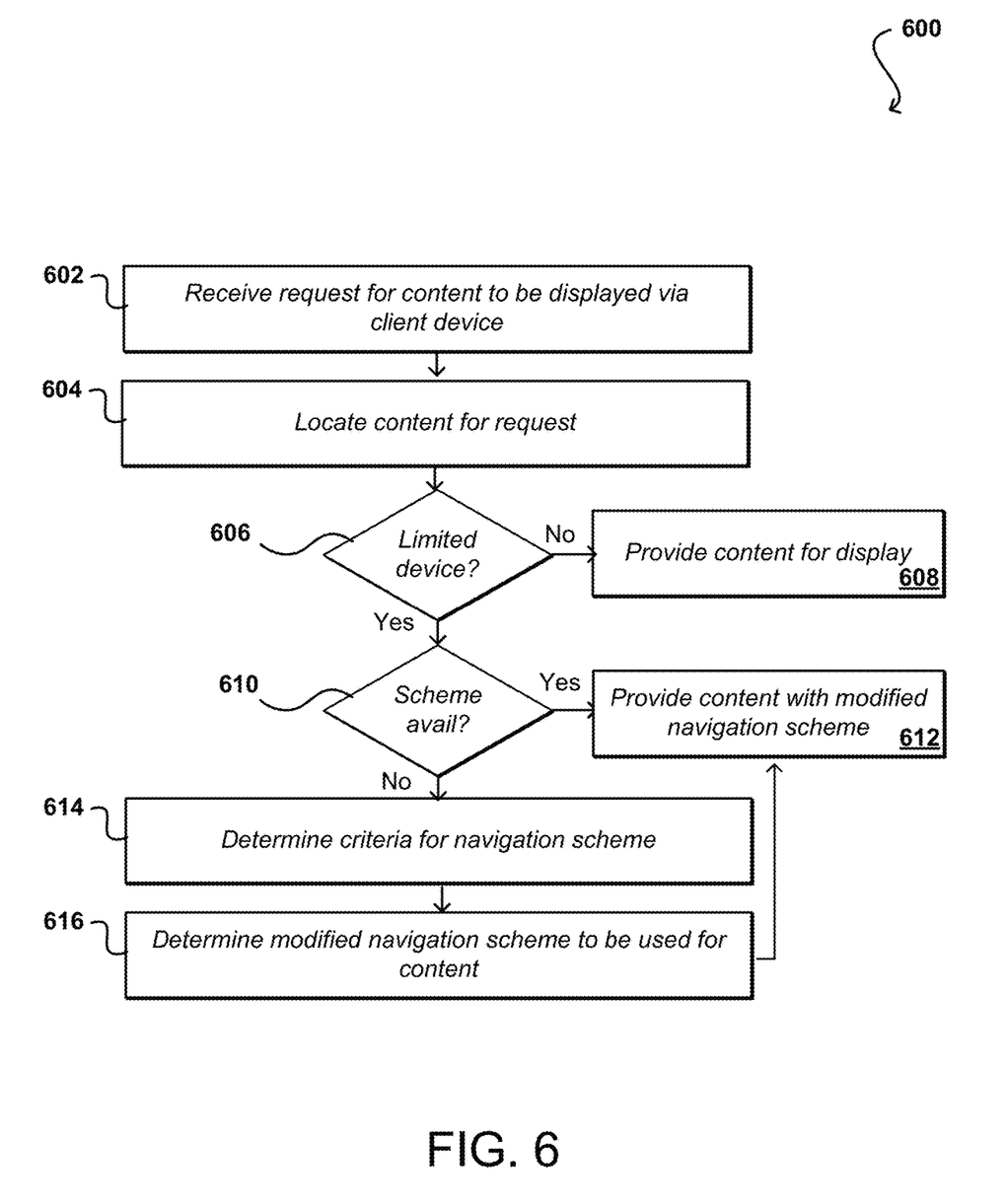
FIG. 6 illustrates an example process for determining whether to generate a modified navigation scheme for content that can be utilized in accordance with various embodiments.

FIG. 6 illustrates an example process 600 for determining whether to generate a modified navigation scheme for identified content that can be utilized in accordance with various embodiments. It should be understood for this and other processes discussed herein that there can be additional, alternative, or fewer steps performed in similar or alternative orders, or in parallel, within the scope of the various embodiments unless otherwise stated. In this example, a request is received 602 that identifies content to be displayed via a client device. The content can be any appropriate content, such as web content identified using a web address or other such identifier. The client device can be any appropriate device as discussed herein, which can include the display device or can send data for display on a separate device, such as for a set top box or streaming media device. The content for the request, or at least the location of the content, can be determined 604. The content can be stored by the entity receiving the request or a third party as known for content distribution. A determination can be made 606 as to whether the device to be used to display the content is of a type that has limited, or unconventional, navigation or input mechanisms for the type of content requested. This can include various types discussed herein, such as devices that use remote controls or voice input. The type of device can be determined using information in, or associated with, the request. If the device is not of such a type then the content can be provided 608 for display.

If, however, it is determined that the client device is of a limited type, then a determination can be made 610 as to whether a version of the content, or additional information for the content, is available that provides a modified navigation scheme for the content. The version information can be stored by the client device, the content provider, or another accessible entity or device. This can include, for example, a modified version of the DOM for a webpage or actionable element data that can be used to modify the DOM, among other such options. As mentioned, DOMs are used as an example but any structure, code, or aspect of the content can be modified as appropriate to provide such a navigation mechanism. If the scheme is available, the content with the modified navigation scheme data can be provided 612 for display via the client device. If the client already has one of those components, then the other can be provided (or an updated version provided) as appropriate. If the navigation scheme data is not available, one or more criteria for the navigation scheme can be determined 614, as may be based at least in part upon the type of client device, the type of content, or user preferences, among other such options. The criteria can be any appropriate criteria as discussed herein, as may relate to a maximum number of items, a minimum or specified type of action to be included, etc. The criteria can then be used to analyze the content to determine 616 a modified navigation scheme to be used when displaying the content via the client device.

Figure 7A:
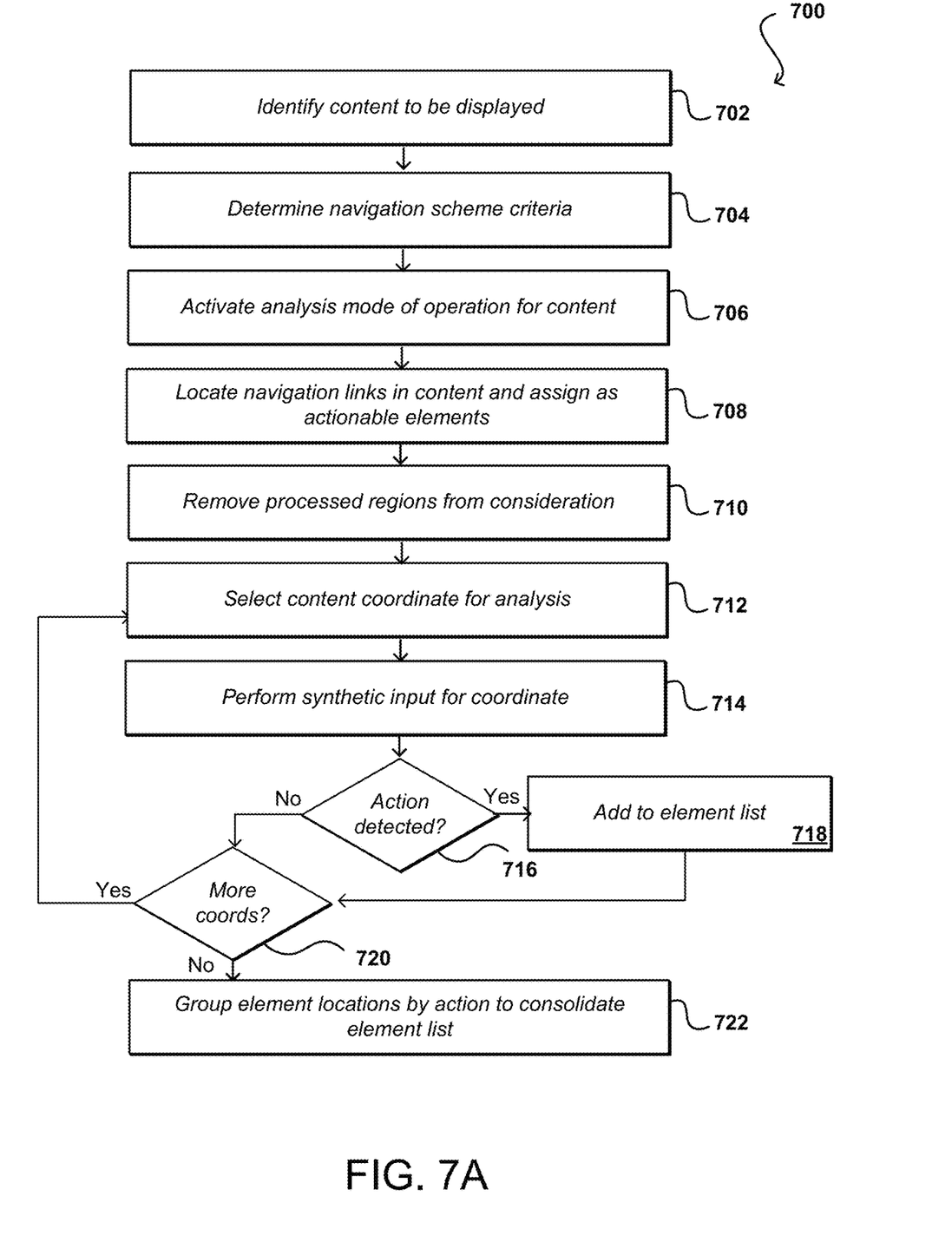
FIGS. 7A and 7B illustrate portions of an example process for generating a modified navigation scheme for content that can be utilized in accordance with various embodiments.
Figure 7B:
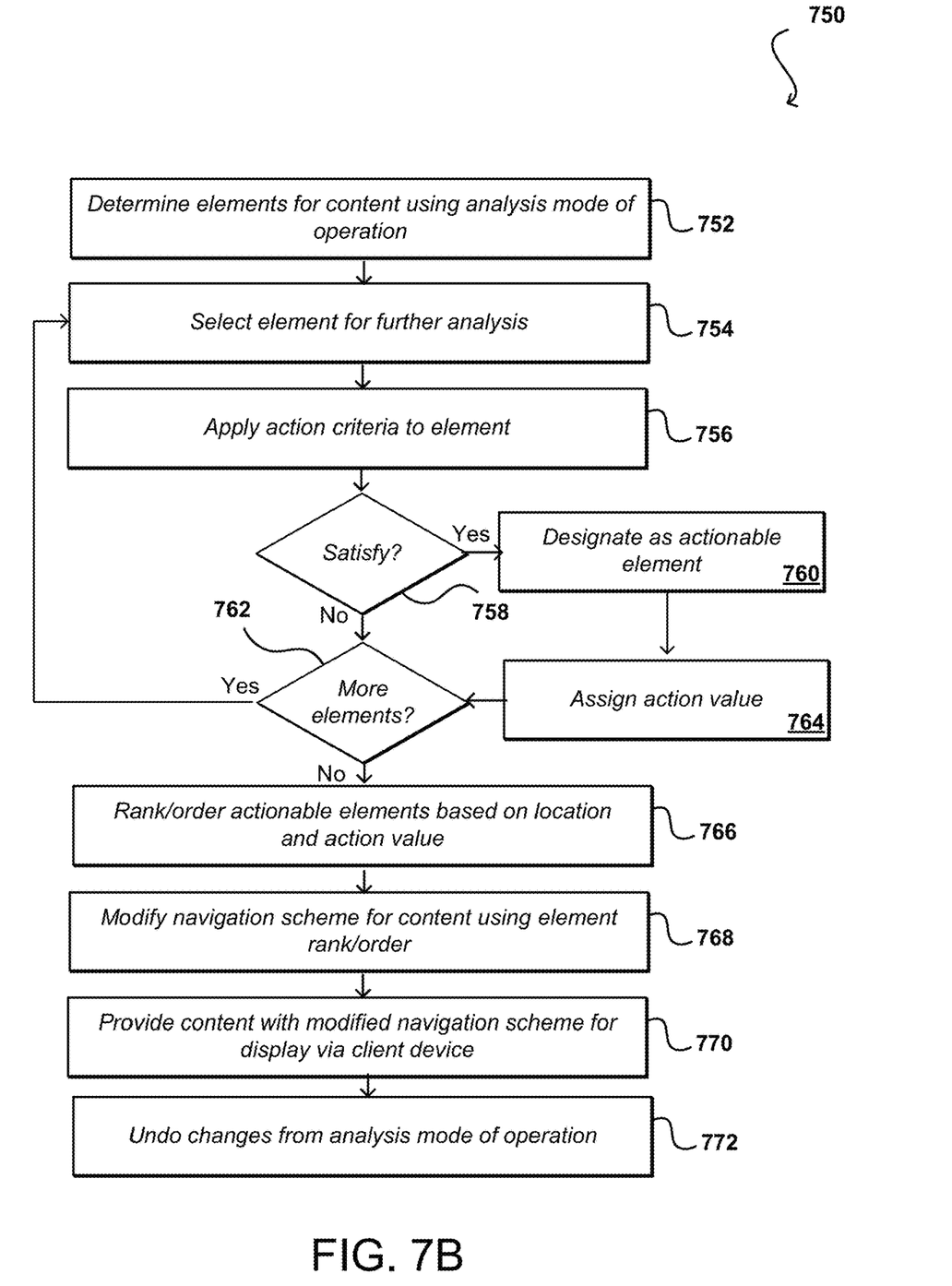

FIGS. 7A and 7B illustrate portions of an example process for identifying actionable elements from content that can be utilized in accordance with various embodiments. In this example portion 700 of FIG. 7A, the content to be displayed is identified 702, such as by using a process similar to that discussed with respect to FIG. 6. The appropriate navigation scheme criteria can be determined 704 as well, as may relate to the type of device used to render, control, and/or display the content, where at least some of those functions may be performed by different devices. In this example, an analysis mode of operation can be activated 706 for purposes of testing the content. The mode can involve creating a shadow or testing copy of the content in some embodiments, where the copy can include at least the structure to be used for displaying the content. For example, if the content is a webpage then the structure such as the DOM or html code can be used for the copy without loading any of the actual image or other content referenced by the structure. In other embodiments this can include operating in a sandbox mode wherein the DOM or other structure of the content can be modified, but the modifications can be reverted and no external actions taken as a result of the testing, as discussed elsewhere herein.

As mentioned, to reduce the time and resources needed for content analysis, at least some amount of pre-processing of the content can be performed. For example, in this process the navigation links (e.g., URLs that point to other pages or domains) and other specified types of elements can be located 708 and assigned as actionable elements. Since these elements are relatively easy to detect, they can be identified quickly in order to reduce the search space for the analysis. Further, in this example any processed regions can be removed 710 from consideration for the analysis. This can include, for example, any background pixels or other non-active regions, regions already tested, regions associated with the previously located links, etc. In some embodiments, the data structure for the content can also be analyzed to determine which regions to exclude, or include, from the analysis.

Once the search space has been identified, a start coordinate can be selected 712 for analysis. This can be an upper left hand pixel coordinate, for example, although any other appropriate start point can be utilized as well. Further, there can be multiple coordinate locations tested in parallel, but this can require additional copies of the structure in at least some embodiments. A synthetic input can be performed 714 for the current test location. This can include, for example, simulating a click or press action at that location. In some embodiments a synthetic touch gesture is sent to an event handler with a scripted listener, and the impact from the scripted code analyzed to determine whether the coordinate on the page should correspond to an actionable element. A determination can be made 716 as to whether any action is detected as a result of the synthetic input. As mentioned, the action can include a call or request being made, a change to the page structure, a call to an API to change a browser state, and so on. The action to be detected could be any action or one of a specified set of actions, among other such options. If such an action is detected, the location can be added 718 to an element list for the content. If no action is detected within a maximum waiting period after the synthetic input, then the coordinate is not added to an element list or other such designation. If it is determined 720 that there are more coordinates to be tested then the next testing coordinate can be selected, according to an appropriate selection criterion or pattern, and the process can continue until all appropriate coordinates are tested or another such end criterion or condition is reached. Once the element coordinates are determined, the coordinate can be grouped 722 or clustered into common elements based at least in part upon their location and a common action being performed. This prevents multiple pixel coordinates for the same graphical element from being included in the list as separate elements.

FIG. 7B illustrates a second portion 750 of the process that takes advantage of this list of elements for specified content. In this example, the elements for the specified content are determined 752, such as may be performed using the process of FIG. 7A. From the list or set of elements, an element can be selected 754 for further analysis. It should be understood that in some embodiments each element, or at least some of the elements, can be tested after, or while, testing to determine whether a coordinate should be associated with an element as well. One or more action criteria can be applied 756 to the element. This can include, for example, determining a type of action that is requested to be performed upon selection of the element, and comparing the type of action against various action criteria, which may specify a type of action, a level of action, a number of similar actions, and the like. If the action is determined 758 to satisfy at least one relevant action criteria then the element can be designated 760 as an actionable element. As mentioned, in some embodiments the action may be assigned a score 760 and only actions at or above a minimum score may be selected, among other such actions. If it is determined 762 that there are more elements in the list then the process can continue with the next element. Otherwise, the actions or action scores can be analyzed.

In this example, the actionable elements on the list can be ranked or ordered 766 based at least in part upon their location in the content and/or their action score. For example, most interfaces will want the user to be able to scroll between ordered elements in a way that has a logical flow, such as from left to right or from the top down. In some embodiments, higher scoring or ranked elements may be ordered higher (or lower) as well, such that the user can more quickly navigate to the most relevant content. Some embodiments may provide a combination of both, wherein the higher ranked elements can be grouped, and then the elements within a given group can be ordered by location. In some embodiments, various input combinations or shortcuts can be used to jump or navigate to specific elements. Such an approach might provide information about the combinations or element identifiers that can help users utilize these navigation approaches instead of scrolling or navigating by element order. Various other approaches can be utilized as well within the scope of the various embodiments.

The navigation scheme for the content can then be modified 768 using the ranking or ordering of the elements, in this example, such that elements can be cycled or scrolled through by using a control button, voice command, or other such input. The content with the modified control scheme can then be provided 770 for display via the client device.

As mentioned, this can include sending a modified version of the content, with modified structure nodes, for example, or providing element location and ordering such that the client device can modify or implement a navigation scheme, among other such options. As mentioned, in at least some embodiments the information can be stored such that the control scheme does not need to be re-derived unless a significant change is detected to the content or the client device, etc. The analysis mode of operation can end, and any changes from the operation undone 772. As mentioned, in at least some embodiments the state information for the original content and any copies can be stored during the testing, such that any or all changes can be reverted to a previous state. This undoing can include, for example, deleting any shadow copies or reverting any changes to the content structure, among other such options.

Figure 8:
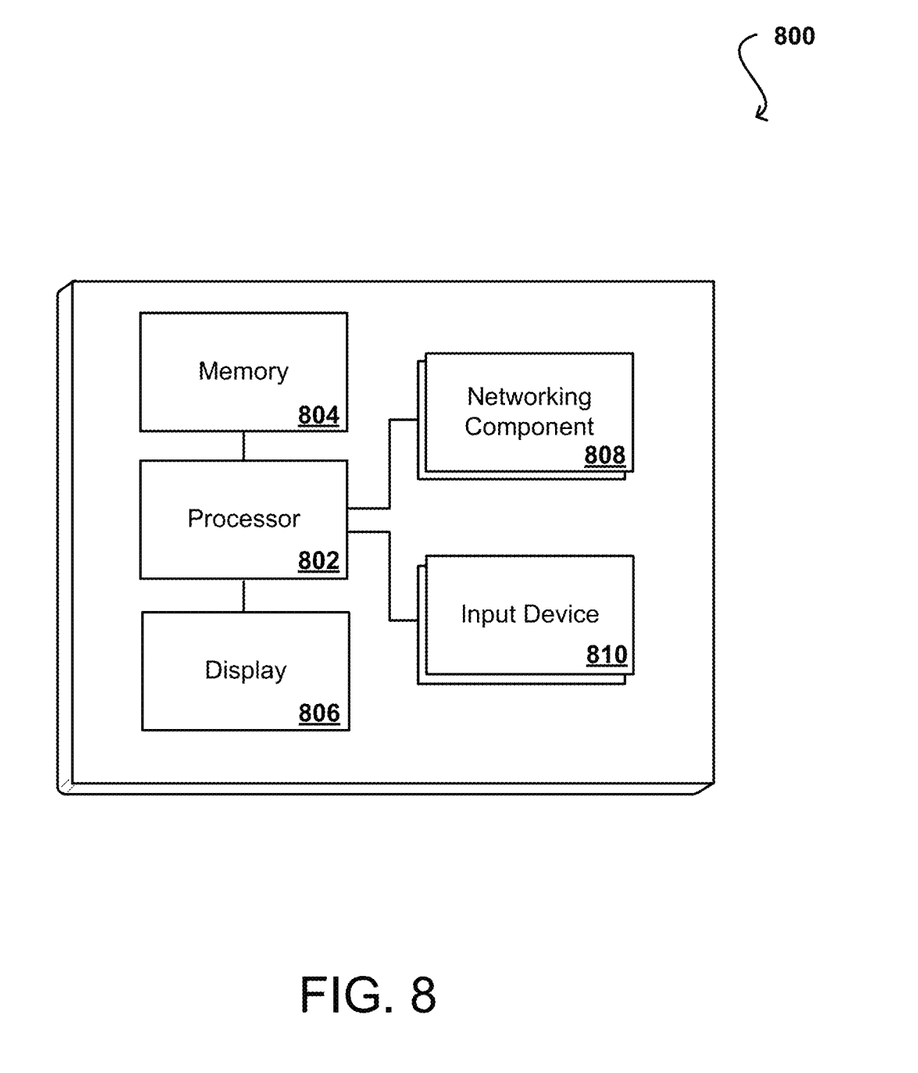
FIG. 8 illustrates example components of a computing device that can be used to implement aspects of the various embodiments.

FIG. 8 illustrates a set of basic components of an example computing device 800 that can be utilized to implement aspects of the various embodiments. In this example, the device includes at least one processor 802 for executing instructions that can be stored in a memory device or element 804. As would be apparent to one of ordinary skill in the art, the device can include many types of memory, data storage or computer-readable media, such as a first data storage for program instructions for execution by the at least one processor 802, the same or separate storage can be used for images or data, a removable memory can be available for sharing information with other devices, and any number of communication approaches can be available for sharing with other devices. The device may include at least one type of display element 806, such as a touch screen, electronic ink (e-ink), organic light emitting diode (OLED) or liquid crystal display (LCD), although devices such as servers might convey information via other means, such as through a system of lights and data transmissions. The device typically will include one or more networking components 808, such as a port, network interface card, or wireless transceiver that enables communication over at least one network. The device can include at least one input device 810 able to receive conventional input from a user. This conventional input can include, for example, a push button, touch pad, touch screen, wheel, joystick, keyboard, mouse, trackball, keypad or any other such device or element whereby a user can input a command to the device. These I/O devices could even be connected by a wireless infrared or Bluetooth or other link as well in some embodiments. In some embodiments, however, such a device might not include any buttons at all and might be controlled only through a combination of visual and audio commands such that a user can control the device without having to be in contact with the device.

As discussed, different approaches can be implemented in various environments in accordance with the described embodiments. As will be appreciated, although a Web-based environment is used for purposes of explanation in several examples presented herein, different environments may be used, as appropriate, to implement various embodiments. The system includes an electronic client device, which can include any appropriate device operable to send and receive requests, messages or information over an appropriate network and convey information back to a user of the device. Examples of such client devices include personal computers, cell phones, handheld messaging devices, laptop computers, set-top boxes, personal data assistants, electronic book readers and the like. The network can include any appropriate network, including an intranet, the Internet, a cellular network, a local area network or any other such network or combination thereof. Components used for such a system can depend at least in part upon the type of network and/or environment selected. Protocols and components for communicating via such a network are well known and will not be discussed herein in detail. Communication over the network can be enabled via wired or wireless connections and combinations thereof. In this example, the network includes the Internet, as the environment includes a Web server for receiving requests and serving content in response thereto, although for other networks, an alternative device serving a similar purpose could be used, as would be apparent to one of ordinary skill in the art.

The illustrative environment includes at least one application server and a data store. It should be understood that there can be several application servers, layers or other elements, processes or components, which may be chained or otherwise configured, which can interact to perform tasks such as obtaining data from an appropriate data store. As used herein, the term "data store" refers to any device or combination of devices capable of storing, accessing and retrieving data, which may include any combination and number of data servers, databases, data storage devices and data storage media, in any standard, distributed or clustered environment. The application server can include any appropriate hardware and software for integrating with the data store as needed to execute aspects of one or more applications for the client device and handling a majority of the data access and business logic for an application. The application server provides access control services in cooperation with the data store and is able to generate content such as text, graphics, audio and/or video to be transferred to the user, which may be served to the user by the Web server in the form of HTML, XML or another appropriate structured language in this example. The handling of all requests and responses, as well as the delivery of content between the client device and the application server, can be handled by the Web server. It should be understood that the Web and application servers are not required and are merely example components, as structured code discussed herein can be executed on any appropriate device or host machine as discussed elsewhere herein.

The data store can include several separate data tables, databases or other data storage mechanisms and media for storing data relating to a particular aspect. For example, the data store illustrated includes mechanisms for storing content (e.g., production data) and user information, which can be used to serve content for the production side. The data store is also shown to include a mechanism for storing log or session data. It should be understood that there can be many other aspects that may need to be stored in the data store, such as page image information and access rights information, which can be stored in any of the above listed mechanisms as appropriate or in additional mechanisms in the data store. The data store is operable, through logic associated therewith, to receive instructions from the application server and obtain, update or otherwise process data in response thereto. In one example, a user might submit a search request for a certain type of item. In this case, the data store might access the user information to verify the identity of the user and can access the catalog detail information to obtain information about items of that type. The information can then be returned to the user, such as in a results listing on a Web page that the user is able to view via a browser on the user device. Information for a particular item of interest can be viewed in a dedicated page or window of the browser.

Each server typically will include an operating system that provides executable program instructions for the general administration and operation of that server and typically will include computer-readable medium storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated. Thus, the depiction of the systems herein should be taken as being illustrative in nature and not limiting to the scope of the disclosure.

The various embodiments can be further implemented in a wide variety of operating environments, which in some cases can include one or more user computers or computing devices which can be used to operate any of a number of applications. User or client devices can include any of a number of general purpose personal computers, such as desktop or notebook computers running a standard operating system, as well as cellular, wireless and handheld devices running mobile software and capable of supporting a number of networking and messaging protocols. Devices capable of generating events or requests can also include wearable computers (e.g., smart watches or glasses), VR headsets, Internet of Things (IoT) devices, voice command recognition systems, and the like. Such a system can also include a number of workstations running any of a variety of commercially-available operating systems and other known applications for purposes such as development and database management. These devices can also include other electronic devices, such as dummy terminals, thin-clients, gaming systems and other devices capable of communicating via a network.

Most embodiments utilize at least one network that would be familiar to those skilled in the art for supporting communications using any of a variety of commercially-available protocols, such as TCP/IP, FTP, UPnP, NFS, and CIFS. The network can be, for example, a local area network, a wide-area network, a virtual private network, the Internet, an intranet, an extranet, a public switched telephone network, an infrared network, a wireless network and any combination thereof.

In embodiments utilizing a Web server, the Web server can run any of a variety of server or mid-tier applications, including HTTP servers, FTP servers, CGI servers, data servers, Java servers and business application servers. The server(s) may also be capable of executing programs or scripts in response requests from user devices, such as by executing one or more Web applications that may be implemented as one or more scripts or programs written in any programming language, such as Java®, C, C# or C++ or any scripting language, such as Perl, Python or TCL, as well as combinations thereof. The server(s) may also include database servers, including without limitation those commercially available from Oracle®, Microsoft®, Sybase® and IBM® as well as open-source servers such as MySQL, Postgres, SQLite, MongoDB, and any other server capable of storing, retrieving and accessing structured or unstructured data. Database servers may include table-based servers, document-based servers, unstructured servers, relational servers, non-relational servers or combinations of these and/or other database servers.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system may also include one or more storage devices, such as disk drives, optical storage devices and solid-state storage devices such as random access memory (RAM) or read-only memory (ROM), as well as removable media devices, memory cards, flash cards, etc.

Such devices can also include a computer-readable storage media reader, a communications device (e.g., a modem, a network card (wireless or wired), an infrared communication device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and other non-transitory computer readable media for containing code, or portions of code, can include any appropriate media known or used in the art, such as but not limited to volatile and non-volatile, removable and non-removable media implemented in any method or technology for storage of information such as computer readable instructions, data structures, program modules or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A computer-implemented method, comprising:
receiving a request to display content via an application executing on a client device, the client device enabling navigational input via a remote control device including a set of directional buttons;
generating a copy of a structure of the content to be displayed;
causing a simulated input to be executed for each of a set of coordinates of the copy, each coordinate corresponding to a respective pixel position of the content when displayed;
determining a subset of coordinates for which a corresponding action is detected in response to the simulated input, the corresponding action detected using a scripted listener of an event handler, the event handler programmed to determine a type of action to be evaluated using a selection criterion;
grouping coordinates of the subset of coordinates based on coordinate regions and corresponding actions into a set of potential elements causing each of the set of potential elements includes coordinates having same corresponding actions;
designating respective potential elements of the set of potential elements as actionable elements in response to the corresponding action satisfying the selection criterion;
generating a navigation scheme for the content based upon the actionable elements;
determining that no graphical interface element in the content corresponds to the actionable elements;
generating a virtual element for the navigation scheme based at least in part on the determining that no graphical interface element in the content corresponds to the actionable elements;
transmitting, responsive to the receiving the request, the content with the navigation scheme having the virtual element to the client device, wherein the application executing on the client device enables navigation of the actionable elements using the directional buttons of the remote control device according to the navigation scheme; and
modifying a structure of a shadow copy of the content in response to designating the actionable elements, wherein the transmitting the content with the navigation scheme to the client device comprises transmitting the modified structure, the modified structure enabling navigation per the navigation scheme.

2. The computer-implemented method of claim 1, further comprising:
determining, based upon information for the request, a device type of the client device, the device type satisfying a navigation scheme generation criterion; and
determining that the navigation scheme does not exist for the content before generating the copy of the structure of the content.

3. The computer-implemented method of claim 1, further comprising:
assigning respective action scores for the actionable elements based upon types of the corresponding actions; and
including, in the navigation scheme, actionable elements whose respective action scores at least meet a minimum action score threshold.

4. The computer-implemented method of claim 3, further comprising:
ranking the actionable elements, to be included in the navigation scheme, according to the respective action scores; and
positioning the actionable elements in the navigation scheme based upon display positions and the ranking of the actionable elements, the positioning controlling a cycle order of the actionable elements in response to selection of one of the input elements of the remote control device.

5. A computer-implemented method, comprising:
identifying content to be displayed using a particular type of device with a specific set of inputs;
analyzing a plurality of display locations of the content to identify selectable elements, the selectable elements identified using simulated input and detecting a corresponding action requested by a script of the content;
determining that no graphical interface element in the content corresponds to the selectable elements;
generating a virtual element for the content based at least in part on the determining that no graphical interface element in the content corresponds to the selectable elements;
analyzing corresponding actions triggered by simulated selections of the selectable elements;
designating at least a subset of the selectable elements as actionable elements in response to the corresponding actions satisfying a selection criterion;
generating a navigation scheme for the content based upon the actionable elements;
transmitting, responsive to receiving a request to display the content via a client device of the particular device type, the content with the navigation scheme having the virtual element to the client device, the navigation scheme executed on the client device and enabling navigation of the actionable elements using the specific set of inputs; and
modifying a structure of a shadow copy of the content in response to designating the actionable elements, wherein the transmitting the content with the navigation scheme to the client device comprises transmitting the modified structure, the modified structure enabling navigation per the navigation scheme.

6. The computer-implemented method of claim 5, further comprising:
determining the particular type of device to be used for displaying the content; and
determining that the navigation scheme for the content is unavailable before analyzing the plurality of display locations to generate the navigation scheme.

7. The computer-implemented method of claim 5, further comprising:
identifying a plurality of navigation links represented in the content;
designating the navigation links as actionable elements;
identifying a region of the content to be excluded from the plurality of analyzed display locations, the region including a region corresponding to the navigation links; and
removing, from a search space, the region before selecting, from the search space, the plurality of display locations of the content.

8. The computer-implemented method of claim 5, further comprising:
saving a current state of the content;
generating the shadow copy of the content; and analyzing the plurality of display locations from the shadow copy.

9. The computer-implemented method of claim 5, further comprising:
storing state information for the content;
modifying the structure for the content in response to actions triggered by simulated selections; and
reverting modifications to the structure based upon the stored state information.

10. The computer-implemented method of claim 5, further comprising:
detecting the corresponding action for a simulated input using a scripted listener of an event handler, the event handler programmed to determine a type of action to be evaluated using the selection criterion.

11. The computer-implemented method of claim 5, wherein the specific set of inputs includes a set of directional buttons, a joystick, a motion, a gesture, or a set of voice commands.

12. The computer-implemented method of claim 5, further comprising:
assigning respective action scores for the actionable elements based upon the types of the corresponding actions; and
including, in the navigation scheme, actionable elements whose respective action scores at least meet a minimum action score threshold.

13. The computer-implemented method of claim 5, further comprising:
ranking the actionable elements, to be included in the navigation scheme, according to the respective action scores; and
positioning the actionable elements in the navigation scheme based upon display positions and the ranking of the actionable elements, the positioning controlling a cycle order of the actionable elements in response to selection of one of the input elements of the remote control device.

14. A system, comprising:
at least one processor; and
memory including instructions that, when executed by the at least one processor, cause the system to:
identify content to be displayed using a particular type of device with a specific set of inputs;
analyze a plurality of display locations of the content to identify selectable elements, the selectable elements identified using simulated input;
detect a corresponding action for the simulated input using a scripted listener of an event handler, the event handler programmed to determine a type of action to be evaluated using a selection criterion;
generating a virtual element for the content, based at least in part on determining that no graphical interface element in the content corresponds to the actionable elements;
analyze corresponding actions triggered by simulated selections of the selectable elements;
designate at least a subset of the selectable elements as actionable elements in response to the corresponding actions satisfying the selection criterion;
generating a navigation scheme for the content based on the actionable elements;
transmit, responsive to receiving a request to display the content via a client device being the particular device type, the content with the navigation scheme having the virtual element to the client device, the navigation scheme executed on the client device and enabling navigation of the actionable elements using the specific set of inputs; and
modify a structure of a shadow copy of the content in response to designating the actionable elements, wherein the transmitting the content with the navigation scheme to the client device comprises transmitting the modified structure, the modified structure enabling navigation per the navigation scheme.

15. The system of claim 14, wherein the instructions when executed further cause the system to:
determine the particular type of device to be used for displaying the content; and
determine that the navigation scheme for the content is unavailable before analyzing the plurality of display locations to generate the navigation scheme.

16. The system of claim 14, wherein the instructions when executed further cause the system to:
save a current state of the content;
generate the shadow copy of the content; and
analyze the plurality of display locations from the shadow copy.

* * * * *